(12) United States Patent
Lin

(10) Patent No.: US 7,109,758 B2
(45) Date of Patent: Sep. 19, 2006

(54) SYSTEM AND METHOD FOR REDUCING SHORT CIRCUIT CURRENT IN A BUFFER

(75) Inventor: Hsiao-Ming Lin, Hsinchu (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/769,521

(22) Filed: Jan. 30, 2004

(65) Prior Publication Data

US 2005/0168250 A1 Aug. 4, 2005

(51) Int. Cl.
*H03K 5/12* (2006.01)
(52) U.S. Cl. .................. 326/112; 326/108; 326/170
(58) Field of Classification Search ........ 327/108–112, 327/170, 379, 391, 427, 581; 326/26, 27, 326/83
See application file for complete search history.

(56) References Cited

U.S. PATENT DOCUMENTS

| | | | | |
|---|---|---|---|---|
| 4,818,901 A | * | 4/1989 | Young et al. .................. 326/27 |
| 5,748,019 A | * | 5/1998 | Wong et al. .................. 327/170 |
| 5,760,620 A | * | 6/1998 | Doluca .......................... 327/112 |
| 6,326,819 B1 | * | 12/2001 | Carlson ......................... 327/108 |
| 6,437,611 B1 | * | 8/2002 | Hsiao et al. .................. 327/108 |

* cited by examiner

*Primary Examiner*—Long Nguyen
(74) *Attorney, Agent, or Firm*—Martine Penilla & Gencarella, LLP

(57) ABSTRACT

A system for reducing a transition short circuit current in an inverter circuit includes a first inverter and a variable resistor set. The first inverter includes a first output node, a first PMOS device, and a first NMOS device. The variable resistor set biases the first inverter such that the first PMOS device is switched at a first time and the first NMOS device is switched at a second time, thereby substantially reducing the transition short circuit current. A method for reducing the transition short circuit current and a buffer circuit also are described.

2 Claims, 5 Drawing Sheets

SYSTEM AND METHOD FOR REDUCING SHORT CIRCUIT CURRENT IN A BUFFER

BACKGROUND OF THE INVENTION

The present invention relates generally to inverter circuits and, more particularly, to a system and method for substantially reducing the current flow during a transition period.

Buffer circuits are used to temporarily hold data while the data is being transferred or processed e.g., within a computer. Buffer circuits often include an inverter circuit that inverts an input data bit or input signal.

FIG. 1A is a schematic diagram of a conventional inverter 100. The inverter 100 includes an input node 102, where an input signal $IN_a$ is applied and an output node 104, where an output signal $OUT_a$ can be taken. The inverter 100 also includes two MOS transistors 110, 112 and an output capacitor 108. The transistors are equal value transistors having opposite polarities in that transistor 110 is a PMOS transistor and transistor 112 is an NMOS transistor. A positive input signal $IN_a$ is inverted to produce a negative output signal $OUT_a$. Conversely, a negative input signal $IN_a$ is inverted to produce a positive output signal $OUT_a$. When the output signal $OUT_a$ is a low state, transistor 112 is conducting. Conversely, when the output signal $OUT_a$ is a high state, transistor 110 is conducting.

FIG. 1B is a timing diagram 150 for the operation of the conventional inverter 100. The inverter 100 does not switch instantaneously but rather gradually switches (or changes state) from high to low output signal $OUT_a$ in response to similarly gradually changing input signal $IN_a$. As shown in FIG. 1B, the input signal $IN_a$ is shown as it transitions from a low state at time $T_1$ to a high state at time $T_5$. The output signal $OUT_a$ is shown transitioning from a high state at time $T_2$ to a low state at time $T_4$, in response to the transitioning state of the input signal $IN_a$.

As discussed above, when the output signal $OUT_a$ is a low state, transistor 112 is conducting and when the output signal $OUT_a$ is a high state, transistor 110 is conducting. Therefore, during the transition period between time $T_2$ and time $T_4$, peaking at about time $T_3$, both transistor 110 and transistor 112 are conducting simultaneously. Because both transistor 110 and transistor 112 are conducting simultaneously a "transition short circuit current," $I_s$, flows from VDD, through transistor 110 and transistor 112 to ground. By way of example, the magnitude of the transition short circuit current, $I_s$, can be about 220 mA at the peak at about time $T_3$.

A transition short circuit current flow, $I_s$, of 220 mA is greater than is necessary for the inverter 100 to invert the input signal $IN_a$. As a result, this excess current flow is wasted power. In view of the foregoing, there is a need for a technique that reduces the transition short circuit current flow and thereby reduces the amount of wasted power.

SUMMARY OF THE INVENTION

Broadly speaking, the present invention fills this need by providing a system and method for substantially reducing the transition short circuit current flow in an inverter or a buffer. It should be appreciated that the present invention can be implemented in numerous ways, including as a process, a system, an apparatus, a computer readable media, or a device.

In accordance with one aspect of the present invention, a system for reducing a transition short circuit current in an inverter circuit is provided. The system includes a first inverter and a variable resistor set. The first inverter includes a first output node, a first PMOS device, and a first NMOS device. The first inverter is biased by the variable resistor set such that the first PMOS device is switched at a first time and the first NMOS device is switched at a second time such that the transition short circuit current is substantially reduced.

In one embodiment, the first PMOS device includes a source coupled to a power source and a drain coupled to the first output node. In one embodiment, the first NMOS device includes a source coupled to ground and a drain coupled to the first output node.

In one embodiment, the variable resistor set includes a second PMOS device, a second NMOS device, a third PMOS device, and a third NMOS device. The second PMOS device has a source coupled to the power source, and a drain coupled to a gate of the first PMOS device. The second NMOS device has a drain coupled to the drain of the second PMOS device, and a gate coupled to the gate of the second PMOS device. The third PMOS device has a source coupled to the source of the second NMOS device, and a drain coupled to the gate of the first NMOS device. The third NMOS device has a source coupled to ground, and a drain coupled to the drain of the third PMOS device.

In one embodiment, the system also includes a second inverter. The second inverter can include a second output node coupled to a first input node of the first inverter, and a second input node. The second inverter also can include a fourth PMOS and a fourth NMOS device. The fourth PMOS device can include a source coupled to the power source, and a drain coupled to the source of the second NMOS device. The fourth NMOS device can include a source coupled to ground, and a drain coupled to the drain of the fourth PMOS device. The second input node can be coupled to the gate of the second PMOS device, the gate of the second NMOS device, the gate of the third PMOS device, the gate of the third NMOS device, the gate of the fourth PMOS device, and the gate of the fourth NMOS device.

In accordance with another aspect of the present invention, a method for reducing a transition short circuit current is provided. In this method, an inverted input signal is received in a first input node on a first inverter, which includes a first PMOS device and a first NMOS device. The first inverter is biased such that the first PMOS device is switched at a first time and the first NMOS device is switched at a second time such that the transition short circuit current is substantially reduced.

In one embodiment a variable resistor set biases the first inverter. In one embodiment, the method further includes receiving an input signal in a second input node in a second inverter, and outputting an inverted input signal from an output node of the second inverter. The output node of the second inverter is coupled to the first input node.

In accordance with yet another aspect of the present invention, a buffer circuit is provided. The buffer circuit includes a first inverter, a variable resistor set, and a second inverter. The first inverter includes a first input node and a first output node. The variable resistor set biases the first inverter such that a transition short circuit current is substantially reduced. The second inverter includes a second input node and a second output node coupled to the first input node of the first inverter.

The present invention advantageously reduces the transition short circuit current so as to substantially increase the power efficiency of an inverter circuit such as may be used in a buffer circuit. Reducing the transition short circuit current in an inverter circuit substantially reduces power consumption and subsequent heat dissipation and cooling requirements for the inverter circuit.

Other aspects and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Several exemplary embodiments for substantially reducing the transition short circuit current flow in an inverter circuit or a buffer circuit will now be described. It will be apparent to those skilled in the art that the present invention may be practiced without some or all of the specific details set forth herein.

The transition short circuit current flow that occurs during transition of an inverter circuit is an inefficient use of the available power. Reducing power consumption of electronic devices is nearly always an electronic design goal. Reducing power consumption in portable electronic devices is a specific goal as portable electronic devices have a limited power supply, typically a battery of some sort. Reducing power consumption in larger electronic devices such as personal computers, server computers, and other electronic devices is an issue due to the electronic device cooling requirements imposed by any excess power consumption.

Figure 2:
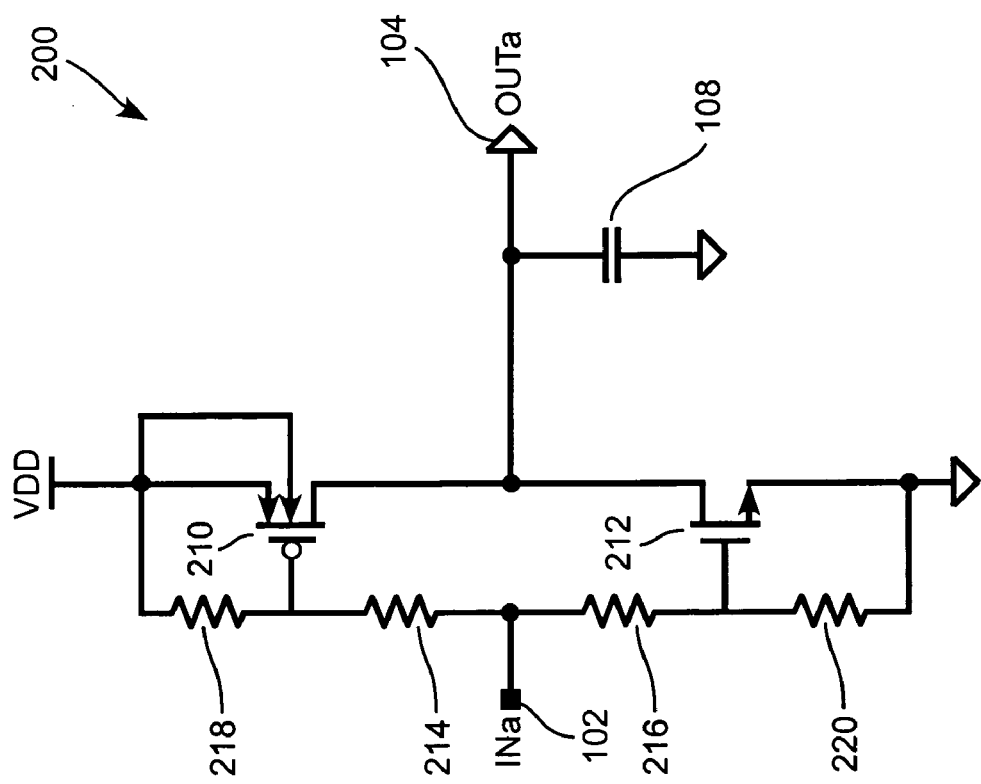
FIG. 2 is a schematic diagram of a resistor-type inverter in accordance with one embodiment of the present invention.

FIG. 2 is a schematic diagram of a resistor-type inverter 200 in accordance with one embodiment of the present invention. Resistors 214, 216, 218, and 220 form a voltage divider network. The voltages of the gates of the transistor 210 and transistor 212 are different from the voltage of the input signal $IN_a$ that is applied to the input node 102 due to the resistors 214, and 216, respectively. As a result, the switch timing of the transistor 210 and the transistor 212 can be shifted to avoid having both transistors 210, 212 conducting at the same time, thereby substantially reducing the transition short circuit current.

However, if the resistor 214 is large, then the switching time of the transistor 210 would be slow, thereby reducing the ability of the inverter 200 to respond to rapid changes in the input signal $IN_a$. Similarly, if the resistor 214 is small, then the current flowing through resistors 216, 218, and 220 will be large, thereby increasing the power consumed by the resistors 216, 218, and 220 and reducing the overall power efficiency of the inverter 200.

One embodiment of the present invention uses an additional circuit to reduce the transition short circuit current during the transition period of the inverter operation. As a result, power is saved. Variable resistors can be used to reduce the transition short circuit current, and thus the disadvantages caused by the resistors in the resistor-type inverter shown in FIG. 2 above are also reduced.

Figure 3A:
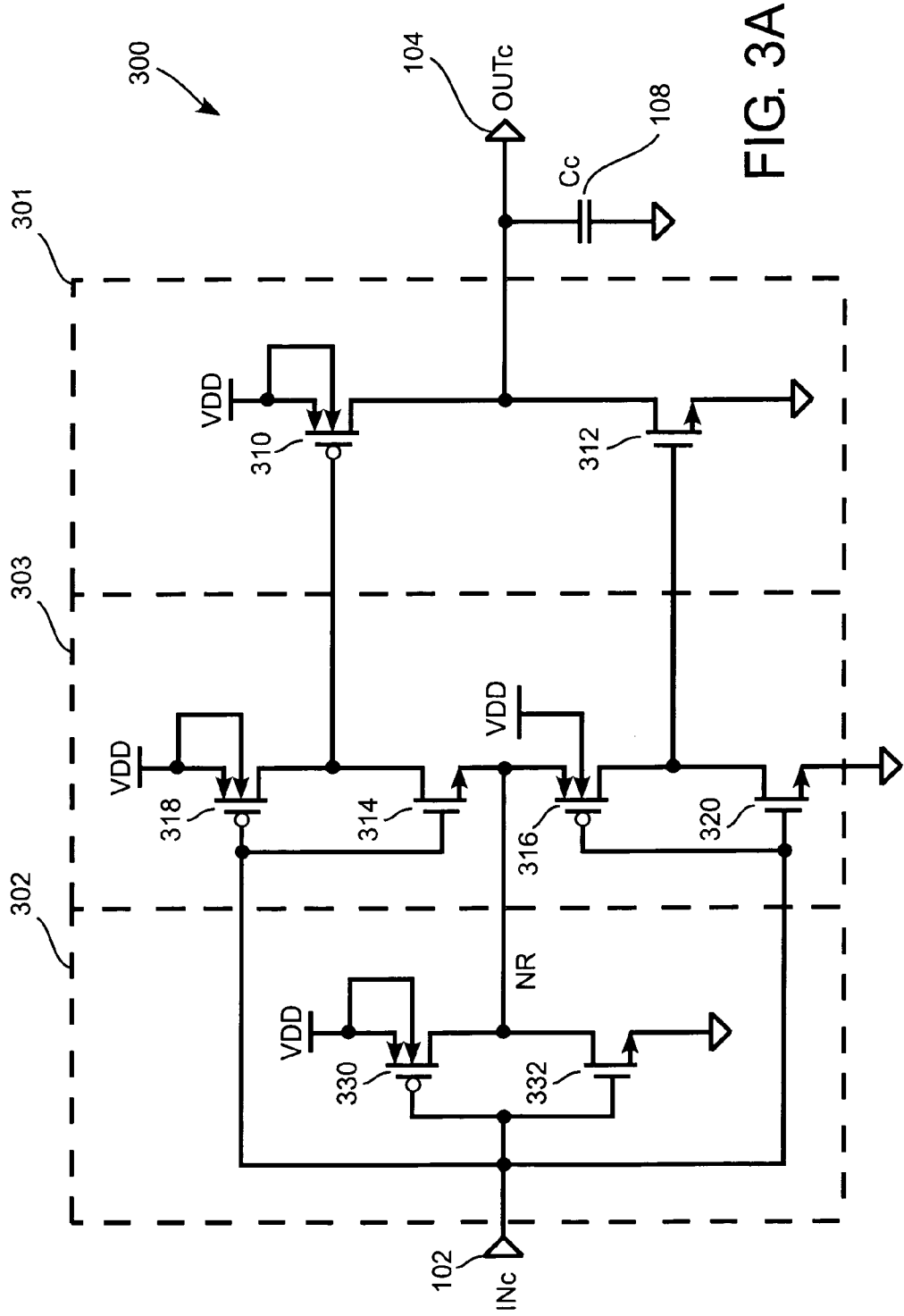
FIG. 3A is a schematic diagram of a buffering circuit in accordance with one embodiment of the present invention.

FIG. 3A is a schematic diagram of a buffering circuit 300 in accordance with one embodiment of the present invention. The buffering circuit 300 includes two inverters 301, 302 and a set of variable resistors 303. The first inverter 301 is the output stage of the buffering circuit 300, and includes PMOS transistor 310 and NMOS transistor 312. The second inverter 302 inverts the input signal $IN_c$ and includes PMOS transistor 330 and NMOS transistor 332.

The set of variable resistors 303 is used for shifting the transition periods for the transistors 310, 312 so that both transistors 310, 312 do not conduct at the same time, which thereby substantially reduces the transition short circuit current. The switching time of a given NMOS or PMOS device is typically determined by the device parameters of the NMOS or PMOS device including such aspects as the physical size of the device, the material of the device, and the manufacturing technology used to produce the device. In one embodiment, the device parameters of NMOS transistor 314 are such that this transistor turns on more slowly than the NMOS transistor 320. The device parameters of transistor 314 also cause this transistor to turn off more quickly than transistor 320. In addition, the device parameters of PMOS transistor 316 are such that this transistor turns on more slowly than PMOS transistor 318. The device parameters of PMOS transistor 316 also cause this transistor to turn off more quickly than PMOS transistor 318. Accordingly, the timing of switching transistors 310, 312 can be shifted.

Figure 3B:
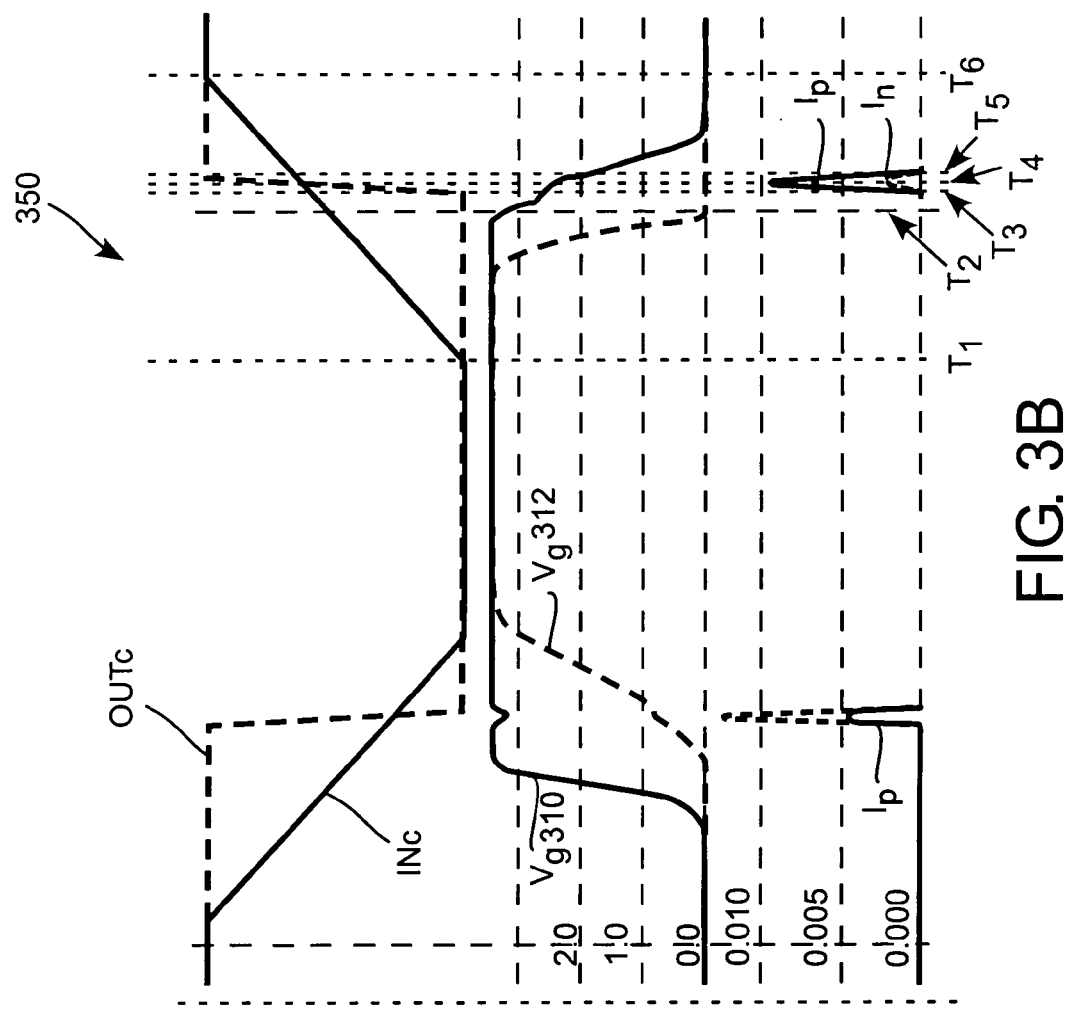
FIG. 3B is a timing diagram of the buffering circuit in accordance with one embodiment of the present invention.

FIG. 3B is a timing diagram 350 of the buffering circuit 300, in accordance with one embodiment of the present invention. The timing diagram 350 includes three graphs aligned in time. A top graph is the input signal INc and the output signal OUTc. A middle graph shows the gate voltages of the transistors 310 and 312 respectively, shown over a voltage range of 0.0 to 2.0. A third graph is a graph of the transition short circuit current $I_p$ shown over a range of 0.000 to 0.010 amperes. The input signal $IN_c$ is shown transitioning from a low level at time $T_1$ to a high level at time $T_6$. As the input signal $IN_c$ transitions to the high level, transistors 314, 320 are conducting. A current flows from the gate of transistor 310, through transistor 314, and across transistor 332, which biases transistor 310. Transistor 310 is biased by Vgs 312 applied to the gate of transistor 310. Current can then flow across transistor 310 and the output signal $OUT_c$ is high.

Because transistor 314 is turned on more slowly than transistor 320 and transistor 316 is turned off more quickly than transistor 318, transistor 312 is therefore turned off more quickly than transistor 310. The transition short circuit current $I_p$ is reduced because transistors 312, 310 are not turned on at the same time. Similarly, when the input signal $IN_c$ is switched from the high level to the low level, a current flows from transistors 330, 316 to the gate of transistor 312, and thus transistor 312 is biased and conducting current $I_{312}$ and the output signal $OUT_c$ is low.

As transistor 314 is turned off more quickly than transistor 320, and transistor 316 is turned on more slowly than transistor 318, transistor 310 is turned off more quickly than transistor 312. Transistors 312, 310 are not turned on at the same time, and therefore the transition short circuit current $I_p$ is substantially reduced.

Transistor 314 is turned off more quickly because when the input signal $IN_c$ is high, the gate to source voltage ($V_{gs}$)

of transistor 314 is high. Thus, when the $IN_c$ is switched to the low level, the voltage on the source ($V_s$) of transistor 314 rises, and the voltage on the gate ($V_g$) of transistor 314 decreases. Therefore, the $V_{gs}$ of transistor 314 decreases quickly, and transistor 314 is turned off quickly.

Transistor 316 is turned off more slowly than transistor 318 because when the input signal $IN_c$ is high, the $V_{gs}$ of transistor 316 is positive. Thus, when the $IN_c$ is switched to the low level, the signal NR, which is the same as $V_s$ of transistor 316, is switched to the high level and therefore the $V_{gs}$ of transistor 316 decreases slowly, and transistor 316 is turned on slowly.

Transistor 316 is turned on more quickly because when the input signal $IN_c$ is low, the $V_{gs}$ of transistor 316 is negative. Thus, when the input signal $IN_c$ is switched to high, the signal NR switches to low, and therefore the $V_{gs}$ of transistor 316 increases quickly, and then transistor 316 is turned off quickly.

Figure 1A:
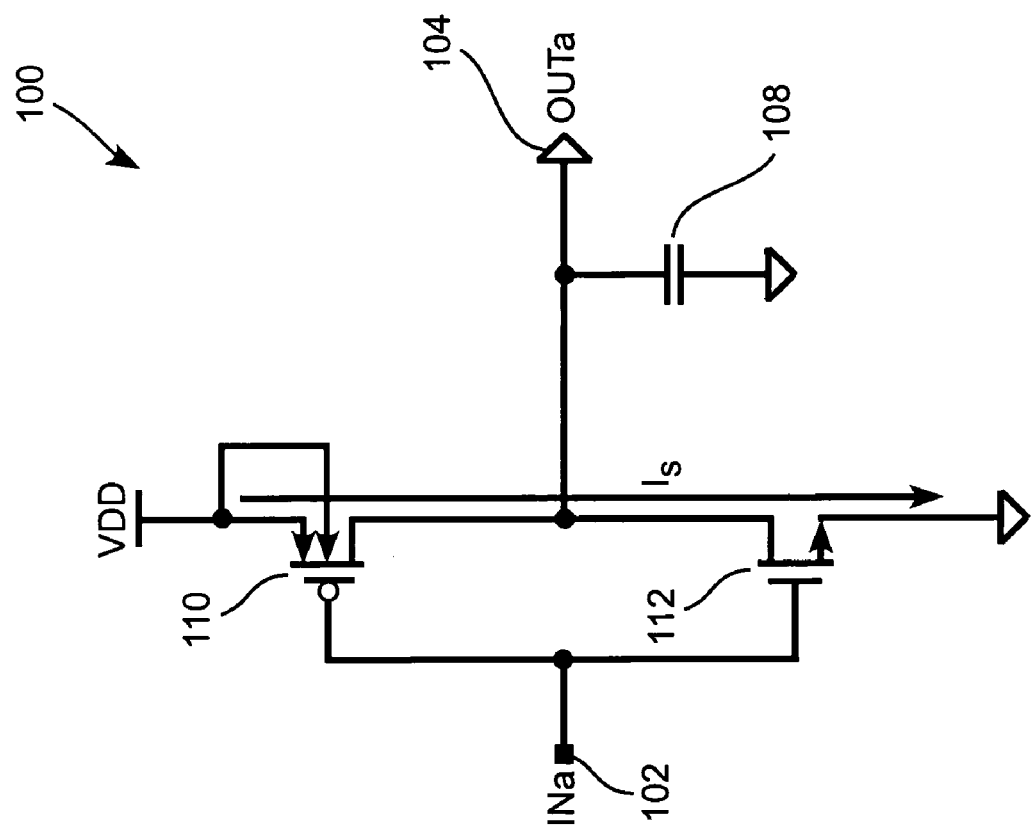
FIG. 1A is a schematic diagram of a conventional inverter.
Figure 1B:
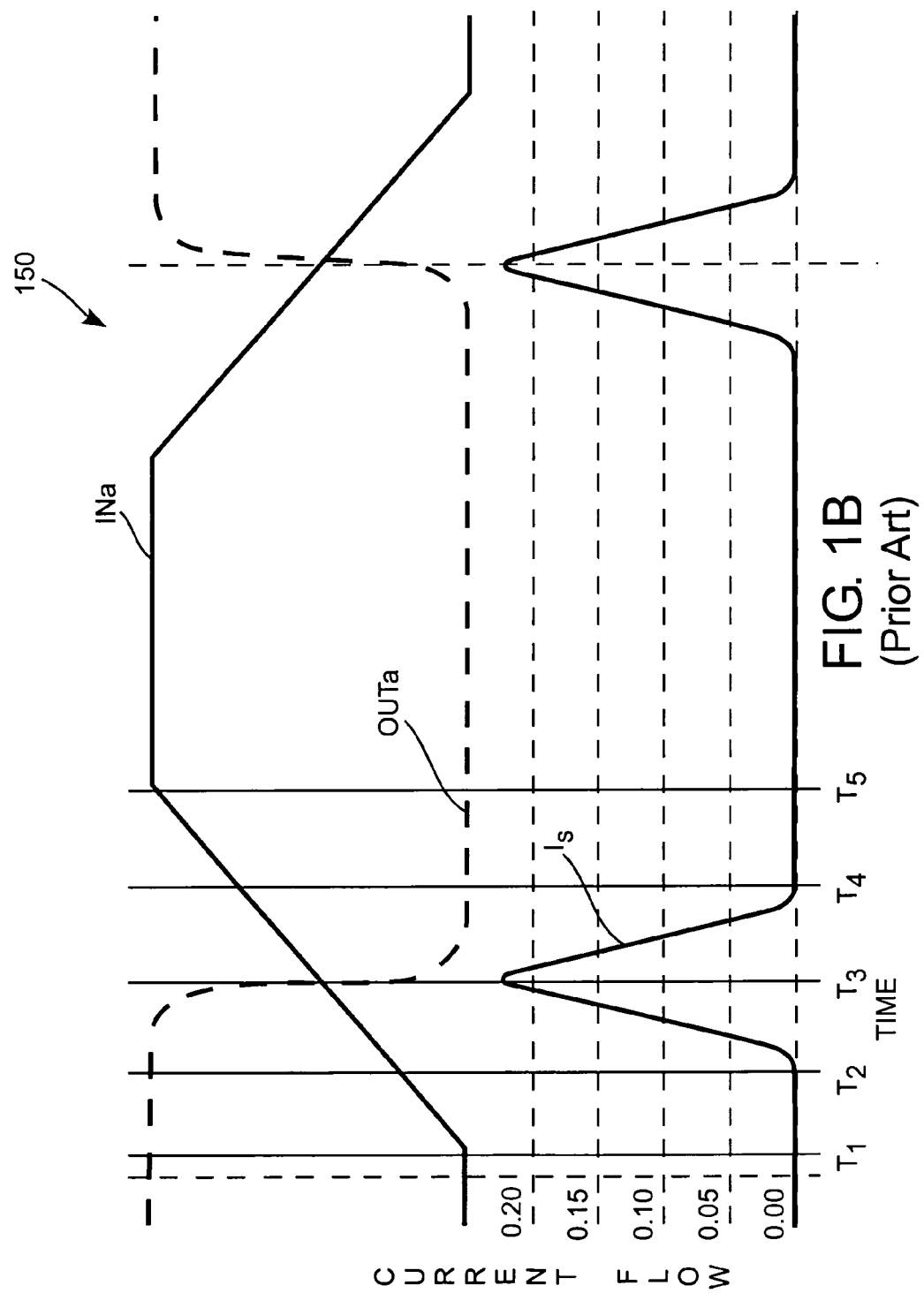
FIG. 1B is a timing diagram for the operation of the conventional inverter.

In this example, the transition short circuit current $I_p$ flowing through transistor 310 and transistor 312 is about 4 mA. The 4 mA transition short circuit current is substantially smaller than the transition short circuit current, $I_s$, of 220 mA, for the conventional inverter 100 shown in FIG. 1 above, when the conventional inverter 100 and buffer 300 have substantially similar performance parameters. While the transition short circuit current may be limited to about 4 mA or even 10 mA, in one or more exemplary embodiments presented herein, the present invention should not be limited to only those transition short circuit current values. Rather, it should be understood that various embodiments presented herein can substantially reduce the transition short circuit current, as compared to a conventional circuit. Further, depending on the specific MOS device size, for example, the transition short circuit current can be any value but will still be substantially reduced as compared to a conventional circuit.

The buffering apparatus uses variable resistors to differentiate the switch timing of PMOS devices and NMOS devices to avoid both PMOS devices and NMOS devices conducting (i.e., being turned on) at the same time, and accordingly the transition short circuit current is reduced.

As used herein in connection with the description of the invention, the term "about" means +/–10%. By way of example, the phrase "about 2.0 volts" indicates a range of between 2.2 and 1.8 volts.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope of the appended claims and equivalents thereof.

What is claimed is:

1. A system for reducing a transition short circuit current comprising:
    a first inverter including an output node, a first PMOS device, and a first NMOS device, the first PMOS device including a source coupled to a power source, and a drain coupled to the output node, and the first NMOS device including a source coupled to ground, and a drain coupled to the output node;
    a variable resistor set, the first inverter being biased by the variable resistor set such that the first PMOS device is switched at a first time and the first NMOS device is switched at a second time such that the transition short circuit current is substantially reduced, the variable resistor set including
        a second PMOS device having a source coupled to the power source and a drain coupled to a gate of the first PMOS device;
        a second NMOS device having a drain coupled to the drain of the second PMOS device, and a gate coupled to the gate of the second PMOS device;
        a third PMOS device having a source coupled to the source of the second NMOS device, and a drain coupled to the gate of the first NMOS device; and
        a third NMOS device having a source coupled to ground and a drain coupled to the drain of the third PMOS device; and
    a second inverter including an input node, and an output node coupled to a first input node of the first inverter through the second NMOS device and to a second input node of the first inverter through the third PMOS device, the second inverter further including
        a fourth PMOS device having a source coupled to the power source, and a drain coupled to the source of the second NMOS device; and
        a fourth NMOS device having a source coupled to ground and a drain coupled to the drain of the fourth PMOS device;
    wherein the input node of the second inverter is coupled to the gate of the second PMOS device, the gate of the second NMOS device, the gate of the third PMOS device, the gate of the third NMOS device, the gate of the fourth PMOS device, and the gate of the fourth NMOS device, and wherein the output node of the first inverter is not coupled to the output node of the second inverter.

2. A buffer circuit, comprising:
    a first inverter including an output node, the first inverter further including
        a first PMOS device having a source coupled to a power source, and a drain coupled to the output node; and
        a first NMOS device having a source coupled to ground, and a drain coupled to the output node;
    a variable resistor set, the first inverter being biased by the variable resistor set such that a transition short circuit current is substantially reduced, the variable resistor set including
        a second PMOS device having a source coupled to the power source and a drain coupled to a gate of the first PMOS device;
        a second NMOS device having a drain coupled to the drain of the second PMOS device, and a gate coupled to the gate of the second PMOS device;
        a third PMOS device having a source coupled to the source of the second NMOS device, and a drain coupled to the gate of the first NMOS device; and
        a third NMOS device having a source coupled to ground and a drain coupled to the drain of the third PMOS device; and
    a second inverter having an input node and an output node, the output node of the second inverter being coupled to a first input node of the first inverter through the second NMOS device and to a second input node of the first inverter through the third PMOS device, and the second inverter further including
        a fourth PMOS device having a source coupled to the power source, and a drain coupled to the source of the second NMOS device; and a fourth NMOS device having a source coupled to ground and a drain coupled to the drain of the fourth PMOS device;

wherein the input node of the second inverter is coupled to the gate of the second PMOS device, the gate of the second NMOS device, the gate of the third PMOS device, the gate of the third NMOS device, the gate of the fourth PMOS device, and the gate of the fourth NMOS device, and wherein the output node of the first inverter is not coupled to the output node of the second inverter.

* * * * *